(12) United States Patent
Kawahara

(10) Patent No.: US 6,876,437 B2
(45) Date of Patent: Apr. 5, 2005

(54) ILLUMINATION OPTICAL SYSTEM, EXPOSURE METHOD AND APPARATUS USING THE SAME

(75) Inventor: Nobuto Kawahara, Tochigi (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 10/631,926

(22) Filed: Jul. 31, 2003

(65) Prior Publication Data

US 2004/0021845 A1 Feb. 5, 2004

(30) Foreign Application Priority Data

Jul. 31, 2002 (JP) ........................... 2002-223265

(51) Int. Cl.$^7$ .................. G03B 27/32; G03B 27/54; G03B 27/72
(52) U.S. Cl. ............... 355/67; 355/71; 355/77
(58) Field of Search ............... 355/67, 71, 77

(56) References Cited

U.S. PATENT DOCUMENTS

| | | | | |
|---|---|---|---|---|
| 3,492,635 A | * | 1/1970 | Farr ............................ | 367/43 |
| 3,854,816 A | * | 12/1974 | Fujimura ...................... | 355/71 |
| 3,980,407 A | * | 9/1976 | Hill .............................. | 355/71 |
| 5,053,934 A | * | 10/1991 | Krebs ........................... | 362/281 |
| 5,264,898 A | * | 11/1993 | Kamon et al. .................. | 355/67 |
| 5,712,698 A | * | 1/1998 | Poschenrieder et al. ......... | 355/71 |
| 6,452,662 B2 | * | 9/2002 | Mulkens et al. ................ | 355/67 |
| 6,603,533 B2 | * | 8/2003 | Go ................................ | 355/71 |
| 2002/0177048 A1 | | 11/2002 | Saitoh et al. | |

FOREIGN PATENT DOCUMENTS

| | | |
|---|---|---|
| EP | 0 589103 A1 | 9/1992 |
| EP | 0 949 541 A2 | 10/1999 |
| GB | 2 347 517 A | 6/2000 |
| JP | 1-92727 | 4/1989 |
| JP | 5-47628 | 2/1993 |
| JP | 5-251308 | 9/1993 |
| JP | 2000-164498 | 6/2000 |
| JP | 2002-243639 | 8/2002 |

* cited by examiner

Primary Examiner—Rodney Fuller
(74) Attorney, Agent, or Firm—Morgan & Finnegan, LLP

(57) ABSTRACT

An illumination optical system for illuminating a mask using light from a light source includes a shape varying mechanism for continuously making a shape of an effective light source variable, wherein the shape varying mechanism includes a first stop plate that has a first aperture part for allowing the light to pass through the first aperture part, and a second stop plate that has second aperture part for allowing the light that has passed through the first stop plate through the second aperture part.

16 Claims, 19 Drawing Sheets

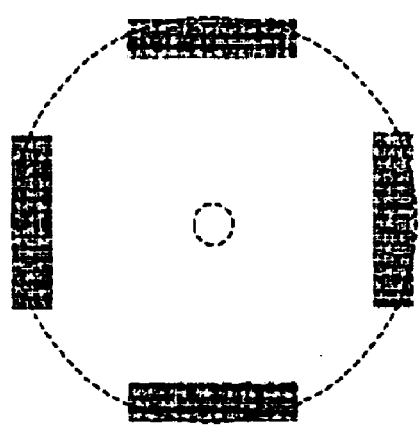 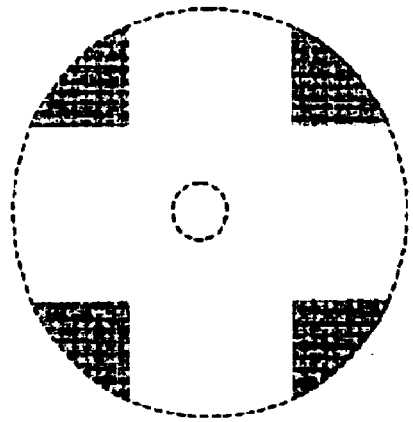
FIG.16A    FIG.16B
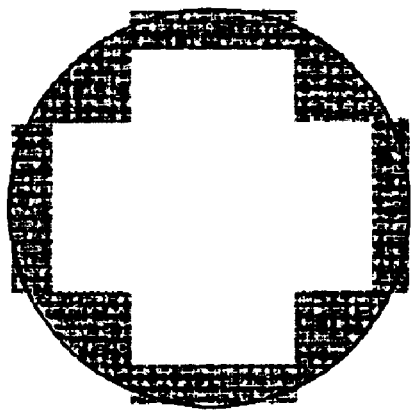
FIG.16C

RESOVED PATTERN    EFFECTIVE LIGHT-SOURCE SHAPE

PRIOR ART

PRIOR ART

ILLUMINATION OPTICAL SYSTEM, EXPOSURE METHOD AND APPARATUS USING THE SAME

This application claims the right of priority under 35 U.S.C. §119 based on Japanese Patent Application No. 2002-223265, filed on Jul. 31, 2002, which is hereby incorporated by reference herein in its entirety as if fully set forth herein.

BACKGROUND OF THE INVENTION

The present invention relates generally to illumination optical systems, and more particularly to an illumination optical system used to manufacture devices, such as single crystal plates for semiconductor wafers and glass plates for liquid crystal displays ("LCD"). The present invention is suitable, for example, for an illumination optical system for projection exposure to an object with a contact-hole line pattern or a mixture of isolated contact hole and contact-hole line in a photolithography process.

Recent demands on smaller and thinner profile electronic devices have increasingly demanded finer semiconductor devices to be mounted onto these electronic devices. In general the photolithography process is used to manufacture highly integrated devices, such as a semiconductor device, a LCD, and a thin film magnetic head. A projection exposure apparatus is an indispensable apparatus for this process to expose a pattern formed on a mask or reticle (these terms are used interchangeably in this application), onto a photoresist-applied substrate, such as a silicone wafer and a glass plate.

The following equation provides the resolution R of the projection exposure apparatus using a light-source wavelength λ and a numerical aperture ("NA") of the projection optical system:

$$R = k_1 \times \frac{\lambda}{NA} \quad (1)$$

A focus range that may maintain certain imaging performance is called a depth of focus ("DOF"), which is defined in the following equation:

$$DOF = k_2 \times \frac{\lambda}{NA^2} \quad (2)$$

While Equations 1 and 2 indicate that a shorter wavelength and a larger NA are effective to finer processing, it is unfeasible since the DOF disadvantageously decreases in inverse proportion to the NA. In addition, the shorter wavelength would disadvantageously reduce transmittance of a glass material, and a larger NA makes difficult a design and manufacture of an optical system.

Accordingly, the resolution enhanced technology ("RET") has been recently proposed which reduces the process constant $k_1$ for fine processing. One RET is modified illumination, which is also referred to as modified illumination, multipolar illumination, or off-axis illumination. The modified illumination arranges an aperture stop with a light blocking plate on an optical axis in an optical system near an exit surface of a light integrator for forming a uniform surface light source, and introduces the exposure light oblique to a mask, as disclosed, for example, in Japanese Laid-Open Patent Application No. 5-47628 (corresponding to EP A1 589103). The modified illumination includes annular illumination and quadrupole illumination, etc. according to shapes of aperture stops.

The annular illumination provides a donut-shaped effective light source area VI on a pupil surface in a projection optical system, as shown in FIG. 24. As the light through center part in the effective light source does not contribute to imaging of a small critical dimension, a stop etc. physically shields the light from the center part to improve the entire resolving power. The quadrupole illumination provides four effective light source areas VI with a certain radius from an optical axis Sa and certain light intensity at circumferential positions, and remarkably improves both the longitudinal and lateral pattern resolving power and DOF by shielding the light on a cross area NI as well as the central part in the effective light source. Here, FIG. 24 is a plane view of an aperture stop having an annular shape, and FIG. 25 is a plane view of an aperture stop having a quadrupole shape. In general, these illuminations are effectively used because a circuit pattern, such as those for an IC and LSI, usually includes a pattern defined by longitudinal and lateral sides and rarely includes diagonal sides.

However, the above illuminations have a common problem in that they cannot vary freely illumination conditions (more specifically, an effective light source shape) and thus cannot provide high resolution to mask patterns whose sizes and arrangements change every process.

The annular illumination and multipolar illumination are means for projecting a mask pattern onto a wafer with high precision and high resolution, and the mask pattern generally is supposed to be a set of longitudinal and lateral line segments. For example, the bipolar illumination arranges an aperture stop shown in FIG. 26 at a side of an exit side of an optical integrator, which aperture stop provides two lateral effective light source areas or openings VI of predetermined light intensity around the optical axis Sa. Here, FIG. 26 is a plane view of the aperture stop having a dipole shape. The aperture stop shown in FIG. 26 is differently used so that it orientates the openings VI longitudinally in resolving a longitudinal pattern with high resolution, and laterally in resolving a lateral pattern with high resolution. A diameter of the opening VI is adjustable according to patterns' critical dimensions and scan-exposure accuracies. A turret plate 1000 arranges plural aperture stops 1100a to 1100f that provide different effective light source shapes as shown in FIG. 27, and selects and uses one of them by inserting the same into and eject the same from the optical path. FIG. 27 is a plane view of a turret plate 1000 to turn plural aperture stops 1100a to 1100f.

Naturally, many types of aperture stops 1100a to 1100f should be prepared in order to select one of finite number of stop plates according to mask-pattern shapes. As discussed, a selection of the stop shape depends upon an addressed pattern direction in a longitudinal or lateral direction. An additional different stop shape would be required for a diagonal pattern other than the longitudinal and lateral directions, making a structure of the turret complex.

In addition, a mechanism has a problem, which rectifies errors of the process precision, assembly precision and correction precision in an apparatus that actually uses the turret plate 1000. For example, a scanning projection exposure apparatus that exposes a mask pattern onto a wafer by synchronously scanning the mask and wafer, as proposed in Japanese Laid-Open Patent Application No. 2000-164498, exhibits synchronization precision in the scan direction inferior to that in the non-scan direction, when precisions of its actual machine are measured, and thus causes different resolving power as imaging performance between the scan direction and non-scan direction. Therefore, while the annular illumination usually uses an aperture stop that has a circular effective light source area VIb as shown in FIG. 28, Japanese Laid-Open Patent Application No. 2000-164498 uses an aperture stop having an elliptical effective light source area VId as shown in FIG. 29, maintaining the optical asymmetry between the scan and non-scan directions. Here, FIG. 28 is a plane view of an aperture stop having a circular annular aperture. FIG. 29 is a plane view of an aperture stop having an elliptical annular aperture.

Although Japanese Laid-Open Patent Application No. 2000-164498 proposes to add the aperture stop having an elliptical annular shape shown in FIG. 29 to a turret plate, this reference does not refer to the multipolar illumination. In addition, the elliptical aperture stop has such a fixed shape that it cannot structurally adjust a size and distortion (ratio) of the ellipse.

BRIEF SUMMARY OF THE INVENTION

Accordingly, it is an exemplified object of the present invention to provide an illumination optical system, as well as an exposure method and apparatus having the same, which may provide an optimal effective light source area or illumination-light shape and relatively vary part of the effective light source area according to mask-pattern shapes.

An illumination optical system of one aspect according to the present invention for illuminating a mask using light from a light source includes a shape varying mechanism for continuously making a shape of an effective light source variable, wherein the shape varying mechanism includes a first stop plate that has a first aperture part for allowing the light to pass through the first aperture part, and a second stop plate that has second aperture part for allowing the light that has passed through the first stop plate through the second aperture part.

The effective light source may have two or four independent areas that decenter from an optical axis of the light. The first aperture part may be almost equal in shape to the second aperture part. The first and second aperture parts may have one of shapes of a sector, a circle, an ellipse, and a polygon. The illumination optical system may further include a shape adjusting mechanism for adjusting a shape of the effective light source and/or a detector for detecting a shape of the effective light source at an exit side of the shape adjusting mechanism. The shape adjusting mechanism may include optics to change a relative ratio of an area of the effective light source. The optics may have a cone or polygonal shape.

The shape varying mechanism may include at least one cylindrical lens, inserted into and ejected from an optical path of the light at a side of the light source, for adjusting an aspect ratio of the effective light source. A direction of a generating line of the cylindrical lens may be rotatably adjusted on a surface orthogonal to optical axis of the light of the effective light source.

The effective light source may have a sectional area that decenters from an optical axis of the light. The shape varying mechanism may vary a shape of the sectoral area in a radial direction continuously.

An exposure method of another aspect according to the present invention includes the step of illuminating a mask that arranges a contact-hole pattern and an auxiliary pattern smaller than the contact-hole pattern, using the above illumination optical system.

An exposure apparatus of still another aspect of the present invention includes the above illumination optical system, and a projection optical system for projecting light from the illumination optical system onto an object to be exposed.

A device fabricating method of still another aspect of the present invention includes the steps of exposing an object using the above exposure apparatus, and performing a predetermined process for the exposed object. Claims for a device fabricating method that performs operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

BRIEF DESCRIPTION OF THE DRAWINGS

FIG. 16 is a schematic view for explaining an effective light source shape.

DETAILED DESCRIPTION OF THE PREFERRED EMBODIMENTS

Referring now to the accompanying drawings, a description will be now given of an exposure apparatus 1 according to the present invention.

Figure 1:
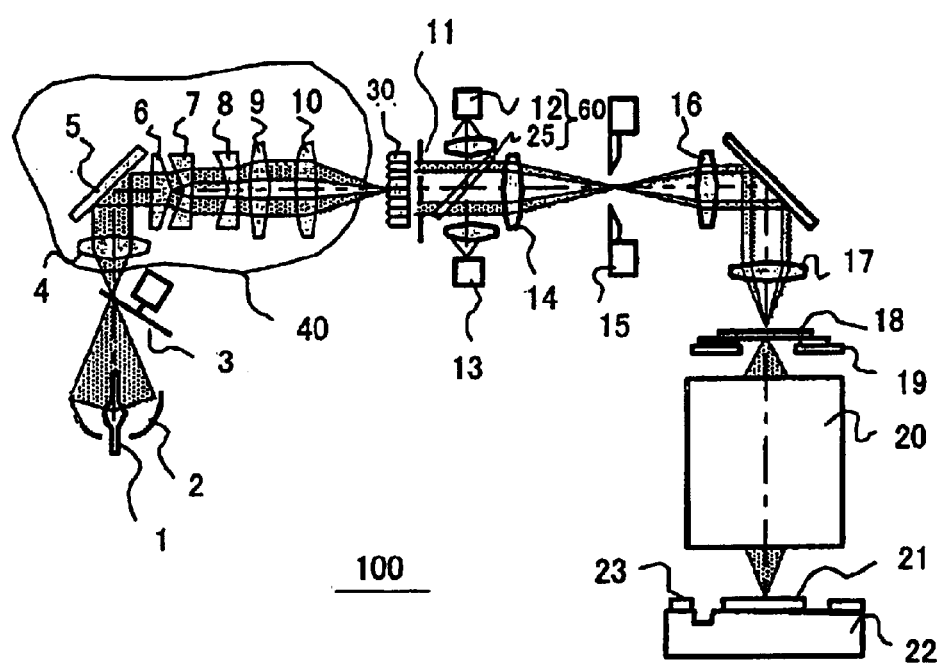
FIG. 1 is a schematic structural view of an exposure apparatus of one embodiment according to the present invention.

FIG. 1 is a schematic structural view of an exposure apparatus 100 of one embodiment according to the present invention. The exposure apparatus 100 is a scanning projection exposure apparatus that illuminates a mask 18 that forms a pattern, and projects part of the pattern on the mask 18 onto a wafer 21, by synchronously scanning the mask 18 and the wafer 21. While the instant embodiment discusses using a scan exposure type projection exposure apparatus as an example, the present invention is, of course, applicable to a cell projection type projection exposure apparatus.

Referring to FIG. 1, illumination light or exposure light that has diffused in radial directions from a short arc type mercury lamp 1 is irradiated onto a concave reflector 2, which has a reflective inner surface shaped like a partially cut elliptic paraboloid, and characteristically enables the light that radially emits from a first focal point of the concave reflector 2 to reflect on the inner surface of the ellipse and condense at a second focal point. A bright point of the lamp 1 as a light source is therefore arranged at the first focal point of the concave reflector 2 to condense the illumination light that has diffused in radial directions, onto the second focal point.

The reflective surface of the concave reflector 2 is coated with a cold mirror, which transmits heat ray components among light diffusing from the lamp 1, through the concave reflector 2, and reflects only other wavelength components. A wavelength selection filter then eliminates wavelength components unnecessary for exposure, and condenses the illumination light onto the above second focal point.

The lamp 1 is fixed onto a lamp stage (not shown) and movable relative to the concave reflector 2. A lamp identifying means (not shown) provided in the lamp stage identifies a type of the lamp, and a lamp power supply (not shown) supplies lamp with power that has been adjusted based on the identified type. A shutter 3 may switch between a projection and a block of the illumination light that has been reflected and condensed by the concave reflector 2, and the opening time of the shutter 3 controls irradiation time of illumination light onto the mask 18 and the wafer 21, and adjusts irradiation energy for projection exposure.

A beam shaping mechanism 40 includes a first optical system including a first condenser lens 4, and a second optical system including a second condenser lens 10, and projects an emission image formed near the second focal point of the concave reflector 2 onto an incidence surface of an optical integrator 30 through a deflection mirror 5 and beam adjustment elements 6 to 9.

The beam adjustment elements 6 and 7 combine convex and concave shapes of cone optics or prism, a roof-shape optics and pyramid optics, arrange the combination so that it may be inserted into and ejected from an optical path, and shape a section of illumination light that has passed through the first optical system into an annular shape etc. The beam adjustment elements 8 and 9 combine convex and concave shapes of a cylindrical lens and a toric lens, arrange the combination so that it may be inserted into and ejected from an optical path, and shape an aspect ratio of the light on a surface perpendicular to the optical axis of the illumination light.

An interval between the beam adjustment elements 6 and 7 and an interval between the beam adjustment elements 8 and 9 are adopted to be adjustable, and a shape of the shaped beam is continuously variable while the beam shaping mechanism 40 as a whole maintain telecentricity at an exit side.

The thus shaped illumination light is then condensed by the second optical system 10 and introduced to the optical integrator 30.

The optical integrator 30 two-dimensionally arranges plural fine lenses. The optical integrator 30 forms a secondary light source near its exit surface, and then an aperture stop 11 partially blocks the secondary light source to precisely form a desired shape of illumination light.

A detailed description will be given of structures of the aperture stop 11 and an optical system near the aperture stop 11. The light as the secondary light source emitted from the optical integrator 30 projects and exposes a pattern on the mask 18 onto the wafer 21 through a projection optical system 20. The resolution R is provided in accordance with above Equation 1.

By using a phase-shift method, we can take $k_1$ number at about 0.35, for a practical NA range 0.7 to 0.8. If the NA is designed to be higher for higher resolution, the DOF would become narrower for the wafer 21. Accordingly, the annular illumination and multipolar illumination are used to reconcile the high resolution with the deep DOF, as discussed.

Figure 24:
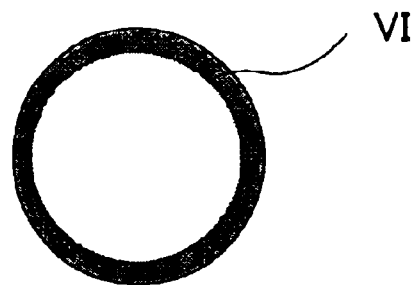
FIG. 24 is a plane view of an aperture stop having an annular shape.
Figure 25:
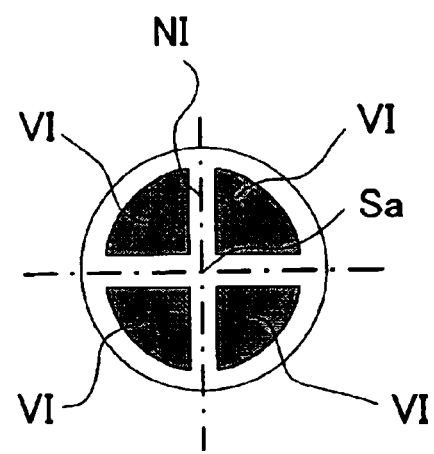
FIG. 25 is a plane view of an aperture stop having a quadrupole shape.
Figure 26:
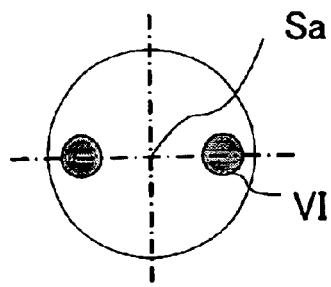
FIG. 26 is a plane view of an aperture stop having a dipole shape.
Figure 28:
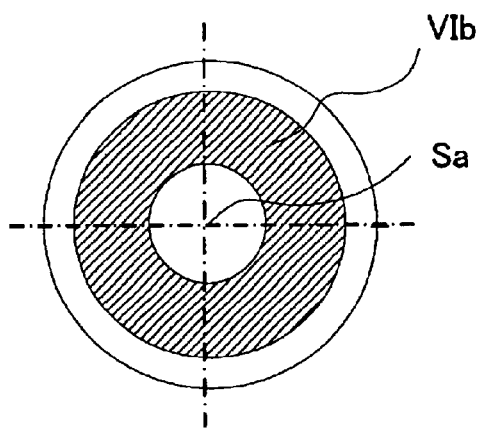
FIG. 28 is a plane view of an aperture stop having a circular annular aperture.
Figure 29:
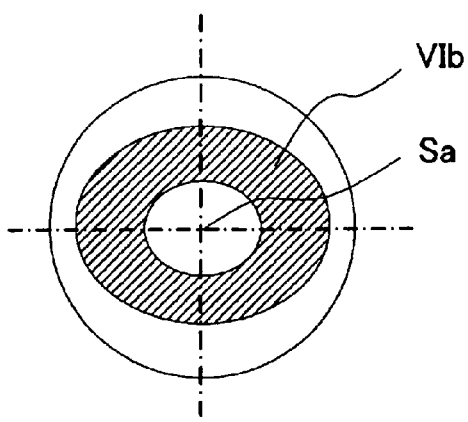
FIG. 29 is a plane view of an aperture stop having an elliptical annular aperture.

The annular illumination inserts a stop plate having an annular opening as an effective light source shown in FIG. 24 or 28 at a position of the aperture stop 11 in the exposure apparatus 100, and adjusts a shape of the illumination light to be irradiated onto the mask 18. For example, the aperture stop shown in FIG. 24 generally sets NA1 as an inner circle numerical aperture equal to or larger than 0.45, NA2 as an outer circle numerical aperture equal to or smaller than 0.85, and a ratio between NA1 and NA2 is between about ½ and about ¾.

Figure 2:
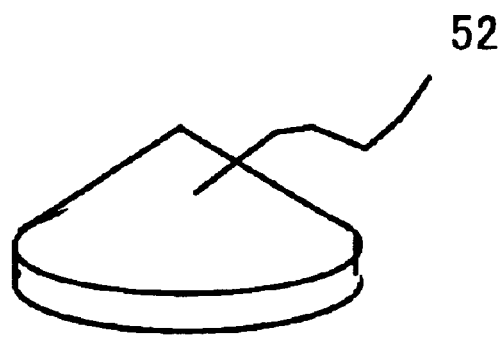
FIG. 2 is a perspective view of cone optics for generating annular illumination light.

The beam shaping mechanism 40 in the exposure apparatus 100 arranges convex cone optics 52 shown in FIG. 2 at a position of the beam adjustment element 6 so as to shape the illumination light into such an annular shape, and arranges concave cone optics inverse to the cone optics 52 at a position of the beam adjustment element 7 so as to maintain the telecentricity of the illumination light. An adjustment of an interval between the convex cone optics 52 and concave cone optics would adjust NA1 as the inner circle in the annular shape. In addition, an iris stop (not shown) may be arranged, as conventionally proposed, at a position of the aperture stop 11 to adjust NA2 as the outer circle in the annular shape and continuously adjust the annular shape of the annular illumination. Here, FIG. 2 is a perspective view of cone optics 52 that shapes the annular illumination light.

Alternatively, an aperture shape or effective light source shape may be determined using a fixture type aperture stop shown in FIG. 24 or 28 just after the optical integrator 30. In this case, the interval between the convex cone optics 52 and concave cone optics positioned at the beam adjustment elements 6 and 7. The illumination light is shaped so as to make a shape of the illumination light irradiated onto the aperture stop 11 slightly wider than the aperture shape of the aperture stop 11, and to maximize the illumination light.

The techniques to shape the illumination light into a desired shape are disclosed, for example, in Japanese Laid-Open Patent Applications Nos. 5-251308 and 2001-35777, and thus a detailed description of the way of arranging each optical element will be omitted. A more preferred embodiment of the present invention arranges an illumination area detector 60 for detecting a beam shape at an exit position of the beam shaping mechanism 40 so that it may be inserted into and ejected from the optical path. This structure may adjust a beam shape by detecting the same.

The exposure apparatus 100 may implement the illumination area detector 60, for example, by arranging a two-dimensional sensor at an incidence surface position of the optical integrator 30. However, this embodiment makes the illumination are detector 60 of the half mirror 25 and two-dimensional sensor 12. This embodiment opens the aperture stop 11, picks up an image of illumination light on the two-dimensional sensor after the half mirror 25 reflects part of the illumination light, and detects the sectional shape of the illumination light. After the shape of the illumination light is detected, an opening of the aperture stop 11 is adjusted to a desired shape, and the two-dimensional sensor 12 detects the beam shape again, compares and adjusts both shapes, and maximizes the illumination light without uselessly shielding illumination light by the aperture stop 11.

Figure 3:
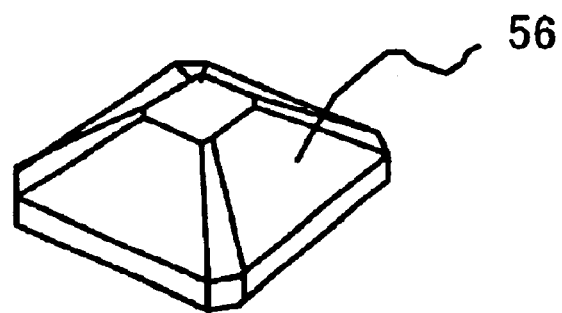
FIG. 3 is a perspective view of pyramid optics for generating multipolar illumination light.

On the other hand, the beam shaping mechanism 40 that uses the multipolar illumination arranges convex pyramid optics 56 shown in FIG. 3 at a position of the beam adjustment element 8 so as to divide the illumination light into plural independent beams, and arranges concave pyramid optics inverse to the cone prism 56 at a position of the beam adjustment element 9 so as to maintain the telecentricity of the illumination light. Here, FIG. 3 is a perspective view of the pyramid optics for shaping the illumination light into a multipolar shape. The beam adjustment elements 6 to 9 may be inserted and ejected, but do not have to exist simultaneously. An interval between the beam adjustment elements 6 and 7, and an interval between the beam adjustment elements 8 and 9 may be fixed so as to maintain the shape of the illumination light.

Figure 4:
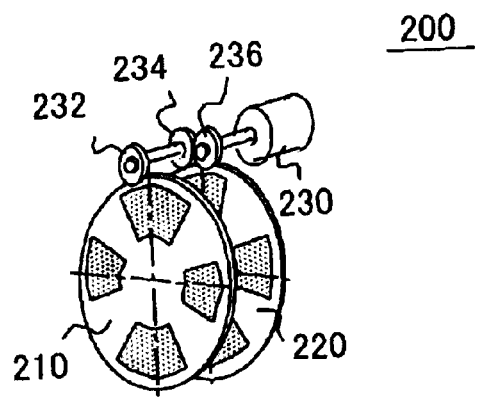
FIG. 4 is a perspective view of an aperture varying mechanism for an inventive aperture stop.
Figure 5:
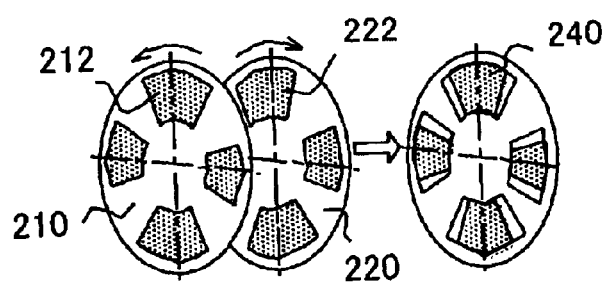
FIG. 5 is a perspective view for explaining an aperture shape formed by two stop plates.

The thus shaped illumination light passes through the optical integrator 30, forms plural secondary light sources, and then is limited their beam shapes by the aperture stop 11. FIG. 4 shows a perspective view of an inventive aperture varying mechanism 200 for the aperture stop 11. The aperture varying mechanism 200 arranges two piled stop plates 210 and 220, for example, at a position of the quadrupole aperture stop 1100d on the turret plate 1000 shown in FIG. 27. The aperture varying mechanism 200 serves as shape varying means for contouring an effective light source shape formed by the optical integrator 30, and making the circumferential shape continuously variable. Two stop plates 210 and 220 include, as shown in FIG. 5, plural sector apertures 212 and 222, and may rotatably drive in an arrow direction in FIG. 5. Here, FIG. 5 is a perspective view for explaining aperture shapes of two stop plates 210 and 220.

While the rotational drive actuator 230 may be provided separately to each of the stop plates 210 and 220, one common actuator 230 may rotationally drive them in reverse directions as shown in FIG. 4. In FIG. 4, gears are formed around a circumference of each of the stop plates 210 and 220. Gears 232, 234 and 236 have the same module. When the actuator 230 drives and the gear 236 rotates counterclockwise, the stop plate 220 rotates clockwise which is engaged with the gear 236. The gear 234 rotates counterclockwise similar to the stop plate 220 and the gear 232 rotates in the same direction, but the stop plate 210 rotates clockwise due to the gear 232. Thus, the stop plate 210 is rotated in an opposite direction to the stop plate 220 by one actuator 230, and the aperture shape 240 shown in FIG. 5 is driven so as to widen the aperture laterally symmetrical with respect to the center axis. For example, the stop plates 210 and 220 have four openings that have the same shape. When they are arranged uniformly in a rotary direction, the common openings 240 are driven so that four aperture widths simultaneously increase or decrease.

Figure 6:
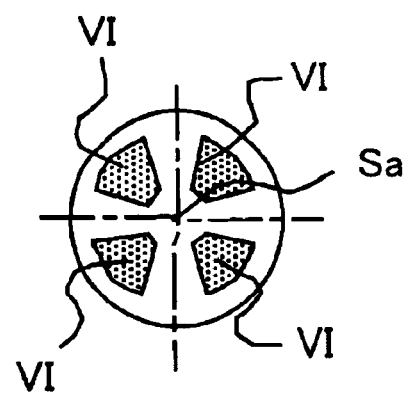
FIG. 6 is a plane view of an aperture stop for forming an effective light source area in a diagonal direction.
Figure 7:
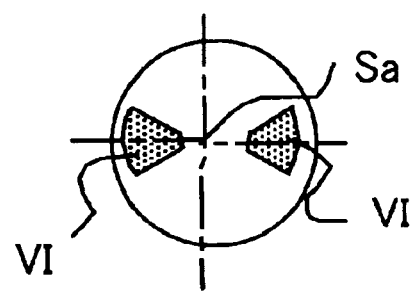
FIG. 7 is a plane view of an aperture stop for forming an effective light source area that includes two opposite sectors.
Figure 8:
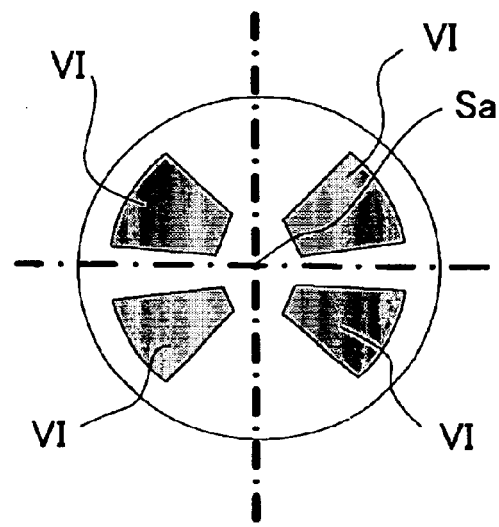
FIG. 8 is a plane view of an aperture stop for forming an effective light source area in a circumferential direction at irregular intervals.

The piled stop plates 210 and 220 do not limit its number and shape shown in FIG. 5. For example, an adjustment of the aperture shapes of the stop plates 210 and 220 would form the effective light source area VI shown in FIG. 6, effective light source area VI that has two opposite sectors as shown in FIG. 7, or an effective light source area VI in the circumferential direction at irregular intervals as shown in FIG. 8. Here, FIG. 6 is a plane view of an aperture stop for forming an effective light source area VI in a diagonal direction. FIG. 7 is a plane view of an aperture stop VI for forming an effective light source area that includes two facing sectors. FIG. 8 is a plane view of an aperture stop for forming an effective light source area VI in a circumferential direction at irregular intervals. The aperture varying mechanism 200 arranges plural piled stop plates having a circular, elliptical or polygonal aperture part, and drives these stop plates independently, thereby forming common overlapping aperture part as a new aperture to set a desired aperture shape. In particular, an aperture shape in a circumferential direction may be varied and adjusted by rotating plural stop pates around an optical axis. Of course, an aperture shape in a radial direction may be similarly varied and adjusted.

Figure 9:
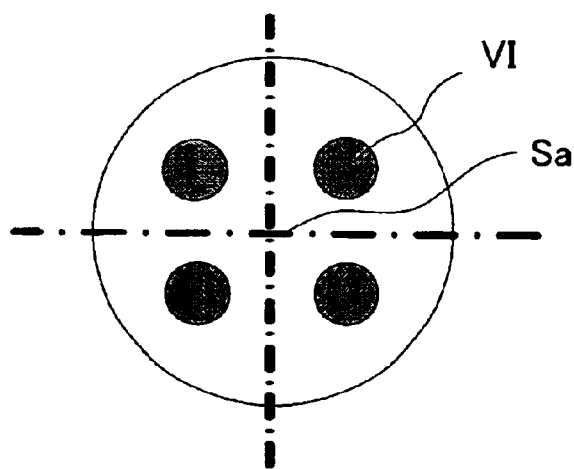
FIG. 9 is a plane view of an aperture stop for forming effective light source shapes that are arranged like a letter X.
Figure 10:
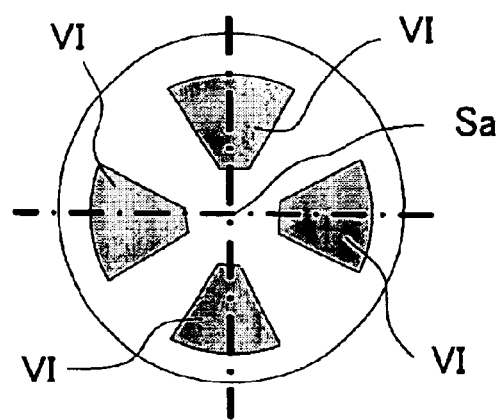
FIG. 10 is a plane view of an aperture stop for forming effective light source areas that are arranged like a cross.

The instant embodiment uses, as shown in FIG. 9, an aperture stop similar to a general quadrupole aperture stop having four effective light source areas VI. Although FIG. 6 uses a quadrupole stop that arranges sectoral effective light source shapes VI like a letter X, an aperture stop shown in FIG. 10 may be used which arranges effective light source areas VI like a cross. Here, FIG. 9 is a plane view of an aperture stop for forming effective light source shapes VI that are arranged like a letter X. FIG. 10 is a plane view of an aperture stop for forming effective light source areas that are arranged like a cross. The instant embodiment easily vary the aperture stop by providing the rotational drive actuator 230 with plural stop plates 210 and 220 and rotating these stop plates 210 and 220 with the same phase entirely.

Alternative to a structure shown in FIG. 4, an additional actuator may be used to rotate plural stop plates 210 and 220 entirely.

Figure 11:
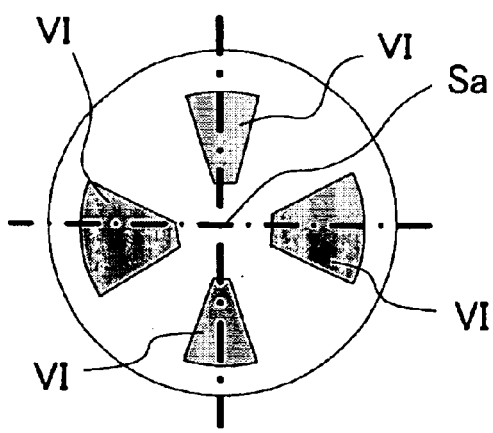
FIG. 11 is a plane view of an aperture stop as a variation of that shown in FIG. 10.

An aperture stop shown in FIG. 11 is another modification of the aperture stop shown in FIG. 10, and effectively serves to form different aperture stop shapes in longitudinal and lateral directions for projection exposure to the mask 18 with different resolution conditions to its longitudinal fringe pattern and transverse fringe pattern. Each shape of the quadrupole effective light source areas VI or openings shown in FIG. 11 may be independently and easily varied by setting a narrow width in the circumferential direction of the stop plate 212 shown in FIG. 5 or by using four or eight stop plates and independently driving them rotationally. FIG. 11 is a plane view of an aperture stop as variation of that of FIG. 10.

A combination with a conventionally used iris stop would adjust diameters of the sectoral inner and outer circles, and a detailed description of this simple additional structure will be omitted.

Figure 12:
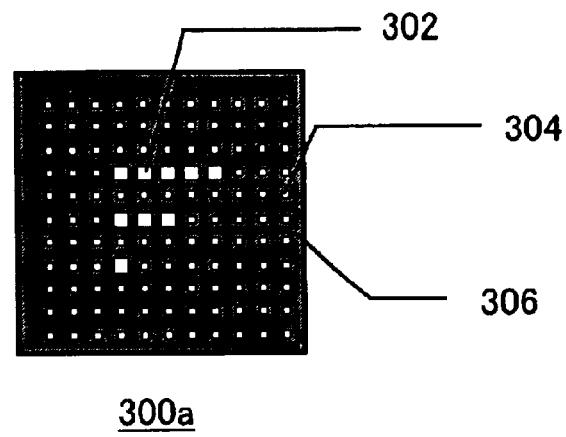
FIG. 12 is a schematic view of a binary mask that forms a desired contact-hole pattern and an auxiliary pattern.

For example, the mask 18 shown in FIG. 1 may use a mask 300a shown in FIG. 12 that arranged a desired contact-hole pattern at a certain period and an auxiliary or dummy contact-hole pattern. FIG. 12 is a schematic view of a binary mask that forms a desired contact-hole pattern and an auxiliary pattern. The mask shown in FIG. 12 as a binary mask thus uses light transmitting part including the desired contact-hole pattern 302 and auxiliary pattern 304, and light blocking part 306. The contact-hole pattern 302 and auxiliary pattern 304 form a two-dimensional contact hole lines arranged with a pitch $P_0=2P$ in longitudinal and lateral directions where P is a hole diameter.

As discussed in detail below, only the desired contact-hole pattern may be exposed with good resolving power onto the wafer 21, by illuminating this mask 300a using cross oblique incidence illumination to resolve the desired contact-hole pattern, and illumination to restrain the dummy resolution by the cross oblique incidence illumination (in other words, to limit the exposure dose for the dummy resolution pattern (a little increased exposure dose) and to enhance the exposure dose for the desired contact-hole pattern (much increased exposure dose)).

Figure 13:
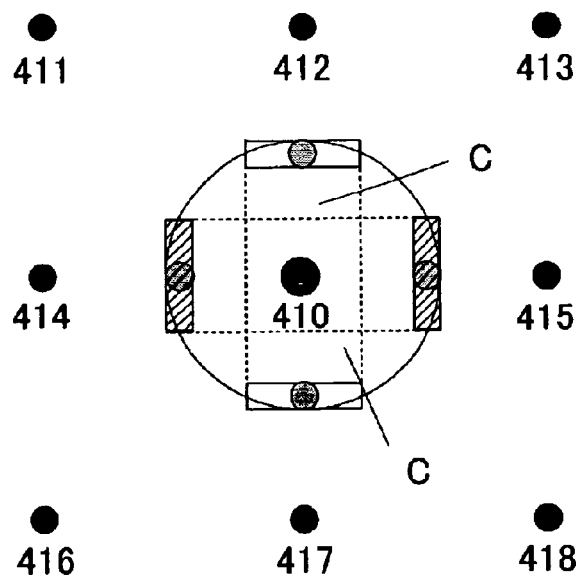
FIG. 13 is a schematic view showing positions of diffracted beams on a pupil surface for small σ illumination to a binary mask shown in FIG. 12, and moving positions of diffracted beams for oblique incidence illumination.

When the mask 300a shown in FIG. 12 that has a small pitch in the contact holes is illuminated with small σ illumination, diffracted beams deviate from the pupil surface in the projection optical system 20 except for the $0^{th}$ order diffracted beam. More specifically, there occur the $0^{th}$ order diffracted beam 410 and diffracted beams 411–418 of other orders as shown in FIG. 13, and diffracted beams except for the $0^{th}$ order diffracted beam deviate from the pupil surface, forming no pattern under this condition. Here, FIG. 13 is a schematic view showing positions of diffracted beams on a pupil surface for small σ illumination to the mask 300a shown in FIG. 12, and moving positions of diffracted beams for oblique incidence illumination.

Figure 14:
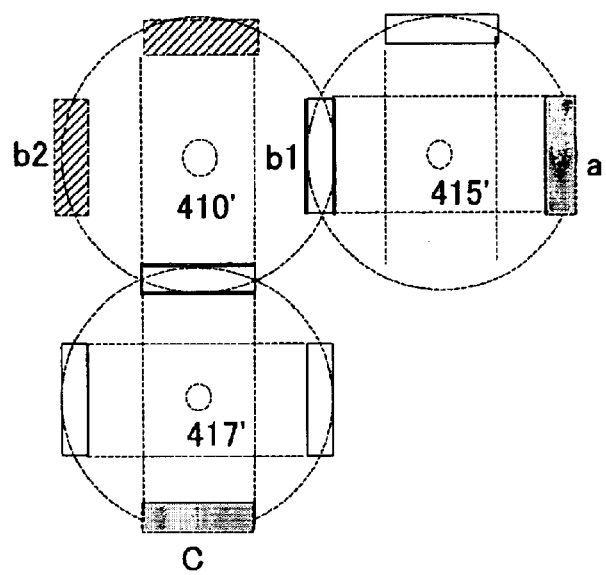
FIG. 14 is a schematic view for explaining an effective light source shape.
Figure 15:
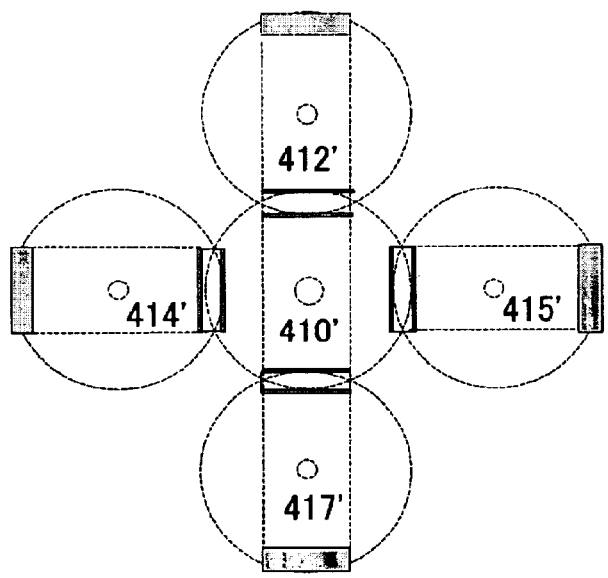
FIG. 15 is a schematic view for explaining an effective light source shape.

Therefore, illumination is required to allow the diffracted beams 411–418 to enter the pupil. For example, in order to allow illustrative two diffracted beams 410 and 415 to enter the bevel area on the pupil surface in the projection optical system 20 shown in FIG. 13, the illumination light may be moved to form oblique incidence illumination as shown in FIG. 14. The diffracted beams 410' and 415' move to rectangular areas b1 and b2 indicated by cross and oblique lines, and enter both ends in the pupil in the projection optical system 20, and interference between these two diffracted beams incident upon the pupil forms linear interference bands at a regular pitch on the wafer 21. The oblique incidence illumination may similarly be set like an area C1 for two diffracted beams 410 and 417 as discussed for the beams 410 and 415. As shown in FIG. 15, four combined rectangular effective light source areas would form linear infringe bands on the wafer 21 at a regular pitch in longitudinal and lateral directions, and strong and weak parts appear at two-dimensional pitches at intersection points overlapping light intensity distributions. The effective light source shape in this case has four rectangles arranged like a cross as shown in FIG. 16A, each of which extends in a direction orthogonal to a radial direction of the pupil.

Figure 17A:
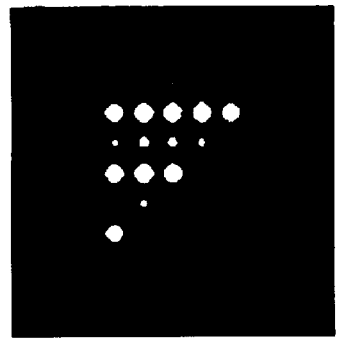
FIG. 17 is a view of simulated resolution pattern on a pattern surface.
Figure 17A:
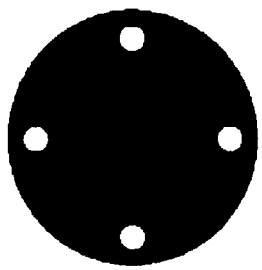
Figure 17B:
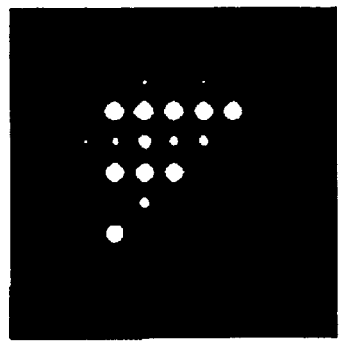
Figure 17B:
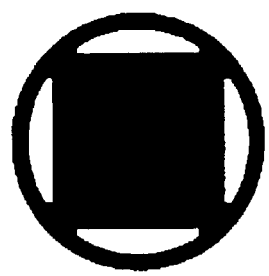

The mask 300a shown in FIG. 12 makes the desired contact-hole pattern larger than the auxiliary pattern so that the desired contact-hole pattern has stronger light intensity than the peripheral, forming the desired contact-hole pattern on the wafer 21. However, as shown in FIGS. 17A and 17B, the mere cross oblique incidence illumination would result in the dummy resolution pattern or an unnecessary pattern other than the desired contact-hole pattern. Here, FIG. 17 is a view of simulated resolved pattern on the wafer 21 corresponding to the right effective light source shape.

Figure 18:
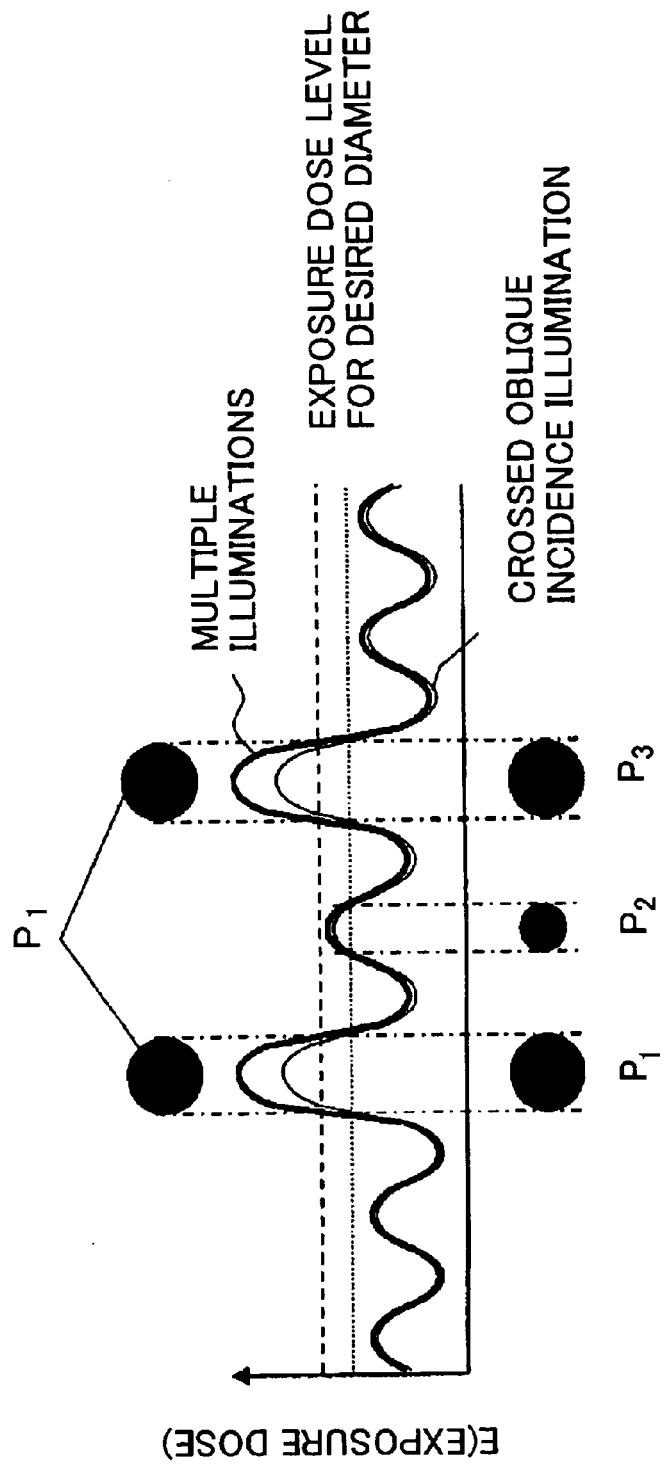
FIG. 18 is a view showing a relationship between exposure dose for modified illumination and an image on a pattern corresponding to the exposure dose.

As shown in FIG. 18, the exposure dose of a thin solid ray resolves an auxiliary pattern P2 between desired patterns P1 at the exposure-dose threshold or resist threshold shown by a thin dotted line in FIG. 18. Here, FIG. 18 shows a relationship between the exposure dose and an image on the wafer 21 corresponding to the exposure dose for the crossed oblique incidence illumination and inventive modified illumination.

Figure 19:
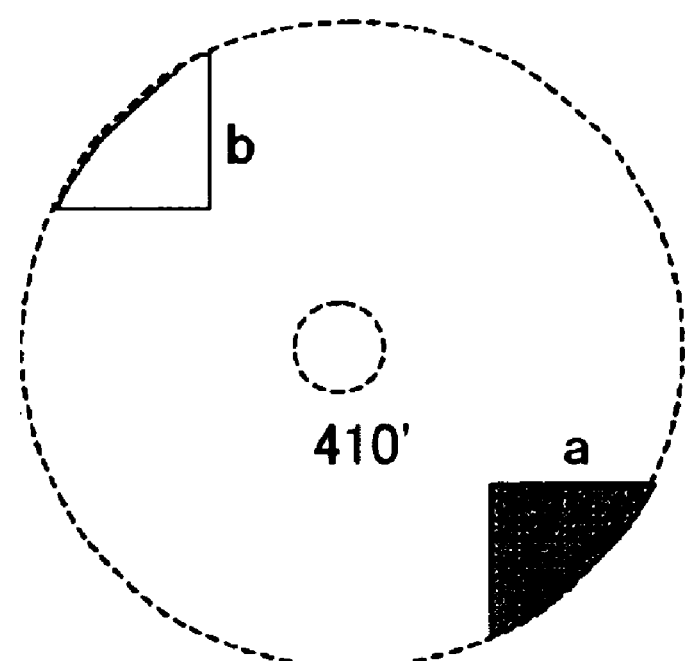
FIG. 19 is a view of an exemplary effective light source shape.

Accordingly, an effective light source distribution is added, as shown in FIG. 13, which allows only one diffracted beam to enter the pupil surface except for an area "c" expressed by linearly connecting two diffracted-light positions on the pupil surface. Preferably, the diffracted beam is $0^{th}$ order diffracted light as the only one diffracted beam because the oblique incidence angle may be made small. FIG. 19 shows an exemplary effective light source distribution. This illumination is available when one diffracted beam 410', for example, is expressed as a dark sectoral area "a". This moves the diffracted beam 410' to a bright sectoral area "b", thereby allowing the diffracted beam to enter the pupil surface. There are four sets corresponding to this condition, after all forming an effective light source shown in FIG. 16B.

Figure 17C:
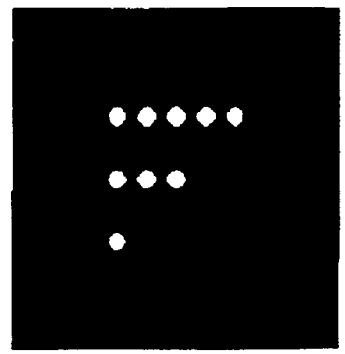
Figure 17C:
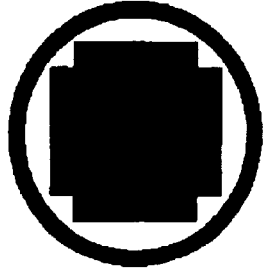

Thus, an illumination system provides modified illumination including an effective light source shape shown in FIG. 16C that has a cross blanked center as a sum of an effective light source shape shown in FIG. 16A that allows two diffracted beams to enter the pupil, and an effective light source shape shown in FIG. 16B that allows one diffracted beam to enter the pupil. Understandably, this modified illumination having such an effective light source shape would resolve only a desired pattern without the dummy resolution, as shown in FIG. 17C.

The exposure dose on the wafer 21 becomes a thick solid ray as shown in FIG. 18, which provides the desired pattern P3 by increasing the exposure dose at part corresponding to the desired pattern on the mask and extinguishing the dummy resolution pattern at the exposure-dose threshold or resist threshold.

It is thus understood that the modified illumination having the effective light source shape shown in FIG. 16C to the mask 300a shown in FIG. 12 increases resolving power for the contact-hole pattern.

Figure 20:
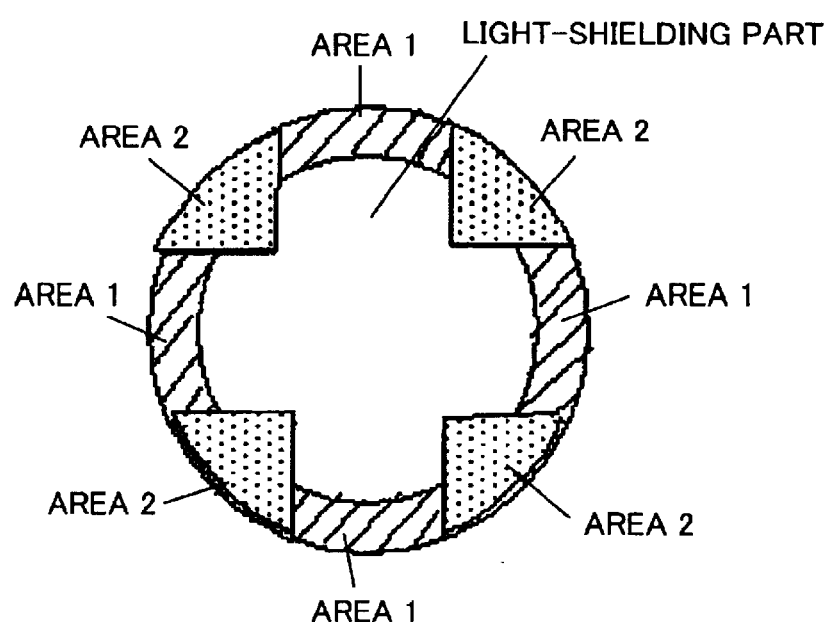
FIG. 20 is a schematic view for explaining an effective light source shape.

The effective light source shape shown in FIG. 16C in the instant embodiment includes illumination area 1 for resolving the desired contact-hole pattern, and illumination area 2 for restraining the dummy resolution by the illumination using the area 1 or for improving a contrast between the desired contact-hole pattern and the auxiliary pattern. See FIG. 20.

A proper combination of stop plates 210 and 220 in the aperture varying mechanism shown in FIG. 4 would be able to easily form the effective light source shape having these areas 1 and 2.

Figure 27:
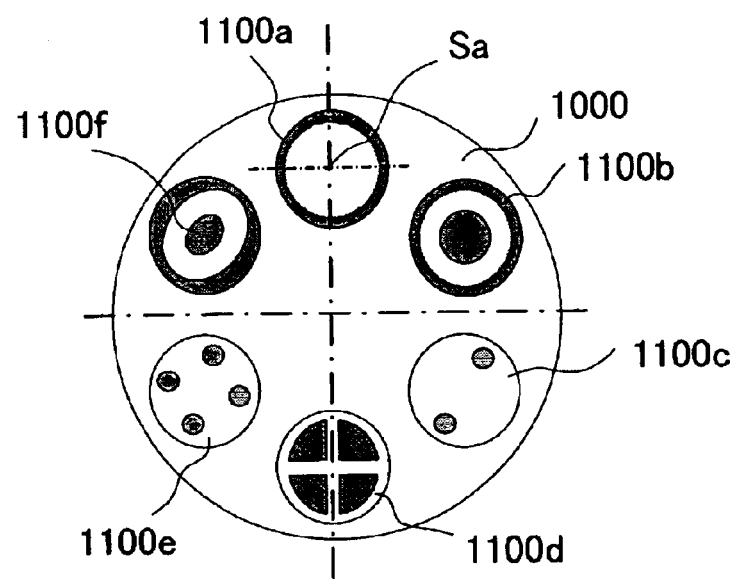
FIG. 27 is a plane view of a turret plate for varying plural aperture stops.

A typical projection exposure apparatus requires effective part between about 50 mm to 150 mm for a beam diameter near the aperture stop 11, and switch time of several seconds to a dozen seconds to exchange an aperture stop when using the turret plate 1000 shown in FIG. 27 as an aperture-stop exchanging mechanism according to the number of switching stages. On the other hand, the inventive method could finish varying an effective light source area shape of an aperture stop within a second, since it simply rotates the stop plates 210 and 220 having the same size as the effective diameter. In particular, a ratio of the switch time of an illumination condition to the entire exposure time is an important factor for the projection exposure that provides the wafer 21 at the same position with multiple exposures with plural different illumination conditions. Therefore, the above switching method not only improves resolution but also productivity.

A half mirror 25 bifurcates an optical path of the illumination light emitted from the aperture stop 11.

The half mirror 25 is coated with a semi-transmitting film having transmittance of 95%, which mostly transmits the illumination light but reflects and condenses part of it onto the sensor 12 for detecting the light quantity to measure an output state of the lamp 1 as a light source. The sensor 12 uses a two-dimensional sensor in the instant embodiment. While the instant embodiment discusses a method that uses a two-dimensional sensor to detect a shape of the illumination area, the sensor is used to detect integrated light quantity of the entire irradiated area. Therefore, the sensor is not limited to a secondary sensor, but may use or be switched to another type of sensor. The detected output of the lamp 1 as a light source is sent to the main control system (not shown), and the illumination light intensity is stably adjusted to a target value by adjusting an output of the power supply that supplies power to the lamp 1.

A lens 14 images on a mobile blind 15 the illumination light that has transmitted through the half mirror, and the light that has passed through an aperture area in the mobile blind 15 proceeds to the lens 16. A detailed structure of the mobile blind 15 is disclosed, for example, in Japanese Laid-Open Patent Application No. 10-92727, and thus a description thereof will be omitted. The mobile blind 15 is located at a position that has a Fourier conversion relationship with the optical integrator 30, and is optically conjugate with the mask 18.

The lenses 16 and 17 constitute an optical system for forming an image on the mobile blind 15 onto the mask 18. This configuration thus projects the illumination light reflecting an image on the mobile blind 15 onto the mask mounted on a mask stage 19 with certain projection magnification β.

The illumination light that transmits through the mask 18 is projected onto the wafer 21 through the projection optical system 20, and consequently a pattern on the mask 18 formed by chrome is transferred on the wafer 21.

The above structure almost similarly applies to a cell exposure type projection exposure apparatus as well as a scan exposure type. The scan exposure type projection exposure apparatus independently mounts the mask 18 and wafer 21 on the mask stage 19 and wafer stage 22 that may move on planes perpendicular to the optical axis of the illumination light, and synchronously scans the mask 18 and wafer 21 in exposure.

The mask stage 19 is fixed onto a structure (not shown) through a static pressure guide, and may be driven in a scan direction by a drive system, such as a linear motor (not shown). The mask stage 19 is driven in accordance with a command by a stage control system that confirms a drive position using a laser interferometer (not shown). The wafer stage 22 is similarly supported on the structure (not shown) via the pressure guide, and the drive system (not shown) such as a linear motor, may two-dimensionally drive the wafer stage 22 in both a scan direction and a slit direction orthogonal to the scan direction. Of course, the wafer stage 22 is driven in accordance with a command by the same or another stage control system that confirms a drive position using a laser interferometer.

The scan exposure synchronously scans these stages. More specifically, the mask stage 19 scans the mask 18 in the scan direction or in a direction reverse to the scan direction, while the wafer stage 22 synchronously scans the wafer 21 in the direction reverse to the scan direction or scan direction.

While Japanese Laid-Open Patent Application No. 2000-164498 discloses a scanning exposure apparatus that forms exemplary elliptical annular illumination corresponding to different synchronization accuracies as discussed, the inventive scanning exposure apparatus 100 uses the aperture varying mechanism 200 shown in FIG. 4 and may easily vary a ratio of illumination light between scan and non-scan directions, for example, in dipole illumination shown in FIG. 7, and in quadrupole illumination shown in FIG. 8.

Figure 21:
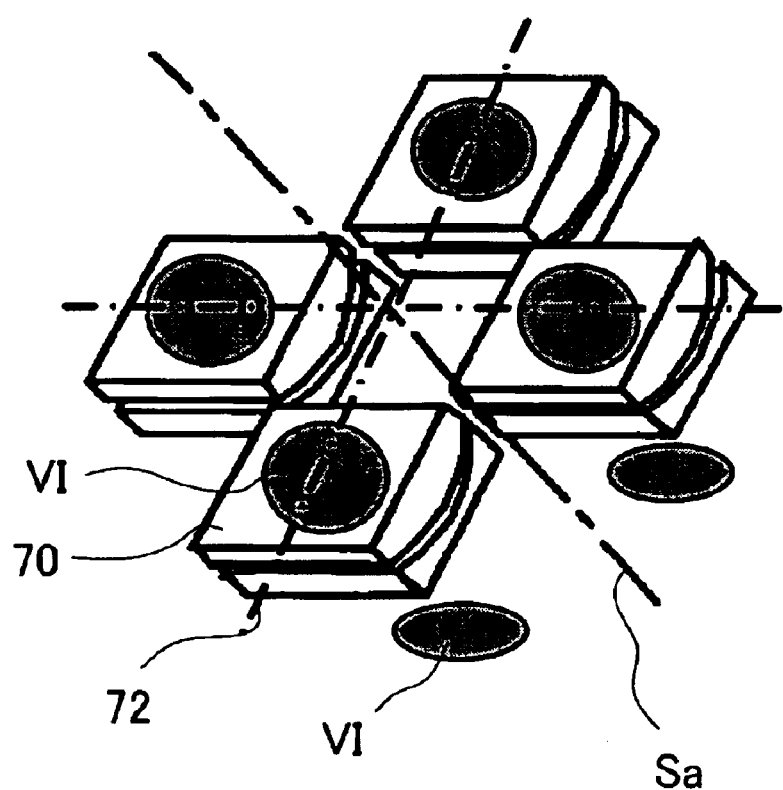
FIG. 21 is a view showing a cylindrical lens as means for adjusting an irradiation shape of illumination light.

FIG. 21 is a view showing cylindrical lenses as means for adjusting an irradiation shape of illumination light. Referring to FIG. 21, a combination of convex and concave shapes of the cylindrical lenses 70 and 72 may continuously vary an aspect ratio of the illumination light of the effective light source area VI at each pole in the quadrupole.

The cylindrical lenses 70 and 72 are formed to have the same a radius of curvature, but have a concave-convex relationship. They are arranged in the same direction of a generating line of the cylindrical surface. Therefore, the cylindrical lens 70 reduces a horizontal component of the effective light source area VI having a circular section, and then the concave cylindrical lens 72 flatten the light to shape the light into an elliptical effective light source area VI.

The above structure may be inserted, for example, between the beam adjustment elements 9 and 10 in the exposure apparatus 100. For example, when the quadrupole aperture stop shown in FIG. 9 is used at the position of the aperture stop 11, the quadrupole effective light source area VI may be shaped into the elliptical shape, and the quadrupole illumination may easily vary a ratio of the illumination light in scan and non-scan directions.

Although FIG. 21 shows four pairs of cylindrical lenses 70 and 72 are aligned with the direction of generating line, it is preferable that these directions of generating lines may be rotationally adjusted independently and an interval between the optical axis Sa and each cylindrical lens pair is adjustable. While the above embodiments use a lamp as a light source, other well-known laser light source is applicable.

Figure 22:
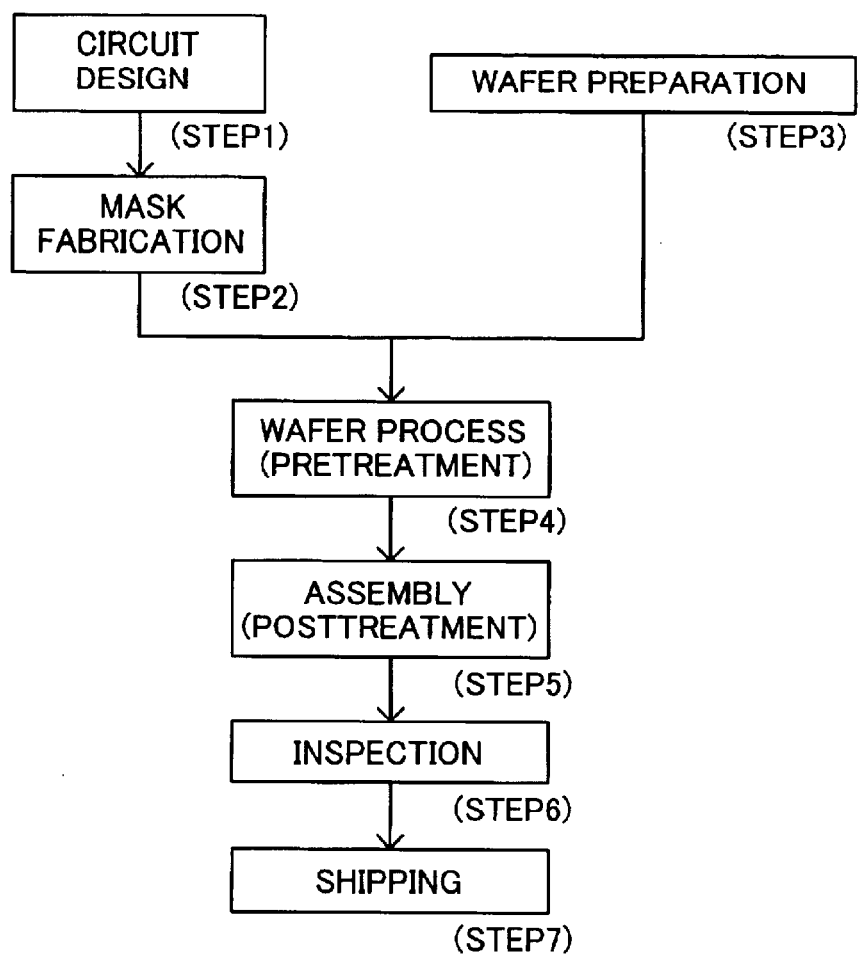
FIG. 22 is a flowchart for explaining how to fabricate devices (such as semiconductor chips such as ICs and LCDs, CCDs, and the like).
Figure 23:
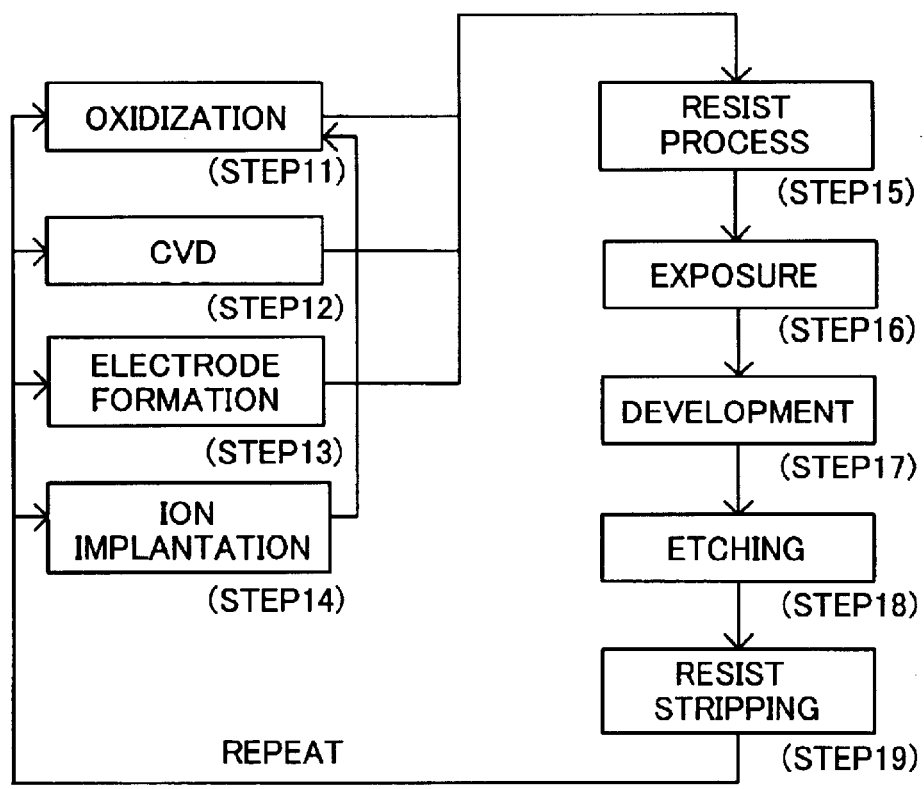
FIG. 23 is a detail flowchart of a wafer process as Step 4 shown in FIG. 22.

Referring now to FIGS. 22 and 23, a description will be given of an embodiment of a device fabricating method using the above exposure apparatus 100. FIG. 22 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 23 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. The wafer may use a sphere semiconductor.

Further, the present invention is not limited to these preferred embodiments, and various variations and modifications may be made without departing from the scope of the present invention.

The inventive illumination optical system thus may provide an optimal illumination condition to a circuit pattern on a mask.

What is claimed is:

1. An illuminating optical system for illuminating a mask using light from a light source, said illumination optical system comprising:
   a shape varying mechanism for continuously varying a shape of an effective light source,
   wherein said shape varying mechanism comprises;
   a first stop plate that has a first aperture part for allowing the light to pass through the first aperture part; and
   a second stop plate that has second aperture part for allowing the light that has passed through the first stop plate through the second aperture part, and
   wherein the first and second stop plates are rotatable around an optical axis of the light.

2. An illumination optical system according to claim 1, wherein said effective light source has two independent areas that decenter from the optical axis.

3. An illumination optical system according to claim 1 wherein said effective light source has four independent areas that decenter from the optical axis.

4. An illumination optical system according to claim 1, wherein the first aperture part is almost equal in shape to the second aperture part.

5. An illumination optical system according to claim 1, wherein the first and second aperture parts have one of shapes of a sector, a circle, an ellipse, and a polygon.

6. An illumination optical system according to claim 1, further comprising a shape adjusting mechanism for adjusting a shape of the effective light source.

7. An illumination optical system according to claim 6, further comprising a detector for detecting a shape of the effective light source at an exit side of said shape adjusting mechanism.

8. An illumination optical system according to claim 6, wherein the shape adjusting mechanism includes optics to change a relative ratio of an area of the effective light source.

9. An illumination optical system according to claim 8, wherein the optics has a cone or polygonal shape.

10. An illumination optical system according to claim 1, wherein the shape varying mechanism includes at least one cylindrical lens, inserted into and ejected from an optical path of the light at a side of the light source, for adjusting an aspect ratio of the effective light source.

11. An illumination optical system according to claim 10, wherein a direction of a generating line of the cylindrical lens is rotatably adjusted on a surface orthogonal to optical axis of the light of the effective light source.

12. An illumination optical system according to claim 1, wherein said effective light source has a sectional area that decenters from the optical axis.

13. An illumination optical system according to claim 12, wherein said shape varying mechanism varies a shape of the sectoral area in a radial direction continuously.

14. An exposure method comprising the step of illuminating a mask that arranges a contact-hole pattern and an auxiliary pattern smaller than the contact-hole pattern, using an illumination optical system for illuminating the mask using light from a light source so as to resolve the contact-hole pattern and restrain the auxiliary pattern from resolving,
   wherein said illumination optical system includes a shape varying mechanism for continuously varying a shape of an effective light source,
   wherein said shape varying mechanism comprises:
   a first stop plate that has a first aperture part for allowing the light to pass through the first aperture part;
   a second stop plate that has a second aperture part for allowing the light that has passed through the first stop plate through the second aperture part; and
   wherein the first and second stop plates are rotatable around an optical axis of the light.

15. An exposure apparatus comprising:
   an illumination optical system for illuminating a mask using light from a light source; and
   a projection optical system for projecting light from said illumination optical system onto an object to be exposed,
   wherein said illumination optical system includes a shape varying mechanism for continuously varying a shape of an effective light source,
   wherein said shape varying mechanism comprises:
   a first stop plate that has a first aperture part for allowing the light to pass through the first aperture part; and
   a second stop plate that has second aperture part for allowing the light that has passed through the first stop plate through the second aperture part; and
   wherein the first and second stop plates are rotatable around an optical axis of the light.

16. A device fabricating method comprising the steps of:
   exposing an object using an exposure apparatus; and
   performing a predetermined process fro the object that has been exposed,
   wherein the exposure apparatus comprises:
   an illumination optical system for illuminating a mask using light from a light source; and
   a projection optical system for projecting light from said illumination optical system onto an object to be exposed,
   wherein said illumination optical system includes a shape varying mechanism for continuously varying a shape of an effective light source,
   wherein said shape varying mechanism comprises:
   a first stop plate that has a first aperture part for allowing the light to pass through the first aperture part; and
   a second stop plate that has second aperture part for allowing the light that has passed through the first stop plate through the second aperture part; and
   wherein the first and second stop plates are rotatable around an optical axis of the light.

* * * * *